(12) United States Patent
Hillard

(10) Patent No.: US 7,327,155 B2
(45) Date of Patent: Feb. 5, 2008

(54) ELASTIC METAL GATE MOS TRANSISTOR FOR SURFACE MOBILITY MEASUREMENT IN SEMICONDUCTOR MATERIALS

(75) Inventor: Robert J. Hillard, Avalon, PA (US)

(73) Assignee: Solid State Measurements, Inc., Pittsburgh, PA (US)

( * ) Notice: Subject to any disclaimer, the term of this patent is extended or adjusted under 35 U.S.C. 154(b) by 60 days.

(21) Appl. No.: 11/281,117

(22) Filed: Nov. 17, 2005

(65) Prior Publication Data

US 2007/0109007 A1 May 17, 2007

(51) Int. Cl.
G01R 31/26 (2006.01)
(52) U.S. Cl. .................... 324/765; 324/750
(58) Field of Classification Search ........ 324/760–769; 257/288, 48; 438/14–18; 702/117–120
See application file for complete search history.

(56) References Cited

U.S. PATENT DOCUMENTS

| | | | |
|---|---|---|---|
| 3,943,442 A | 3/1976 | Fletcher et al. | |
| 4,384,399 A | 5/1983 | Kuo | |
| 5,519,336 A | 5/1996 | Liu et al. | |
| 5,576,630 A | 11/1996 | Fujita | |
| 5,585,736 A | 12/1996 | Hshieh et al. | |
| 5,923,033 A | 7/1999 | Takayama et al. | |
| 6,229,164 B1 * | 5/2001 | Momose et al. ............ | 257/288 |
| 6,275,059 B1 | 8/2001 | Sah et al. | |
| 6,326,220 B1 | 12/2001 | Chen et al. | |
| 6,348,808 B1 | 2/2002 | Yakura | |
| 2002/0008530 A1 | 1/2002 | Kim et al. | |
| 2002/0115258 A1 | 8/2002 | Whang et al. | |
| 2002/0167008 A1 | 11/2002 | Hopson et al. | |
| 2002/0197837 A1 | 12/2002 | Kwak et al. | |

FOREIGN PATENT DOCUMENTS

| | | |
|---|---|---|
| JP | 59033875 A | 2/1984 |
| JP | 59121978 A | 7/1984 |
| JP | 01211936 A | 8/1989 |
| JP | 02001569 A | 1/1990 |
| JP | 03254133 A | 11/1991 |
| JP | 04162771 A | 6/1992 |
| JP | 06194409 A | 7/1994 |
| JP | 10178073 A | 6/1998 |

* cited by examiner

Primary Examiner—Vinh P. Nguyen
(74) Attorney, Agent, or Firm—The Webb Law Firm

(57) ABSTRACT

A semiconductor wafer or sample having a substrate of semiconducting material is tested by compressing a dielectric between three electrically conductive contacts and a top surface of the semiconductor wafer or sample substrate. The dielectric has a thickness that permits tunneling current to flow therethrough without damaging the dielectric. A first electrical bias is applied to a pair of adjacent contacts and a second electrical bias, such as ground reference, is applied to the other contact whereupon an inversion layer forms in the semiconductor wafer or sample. A value of a current that flows in the semiconductor wafer or sample substrate and across the dielectric, in the form of a tunneling current, is measured in response to the applied electrical biases. A surface mobility of minority carriers in the semiconductor wafer or sample is determined as a function of the applied electrical biases and the value of the measured current.

11 Claims, 5 Drawing Sheets

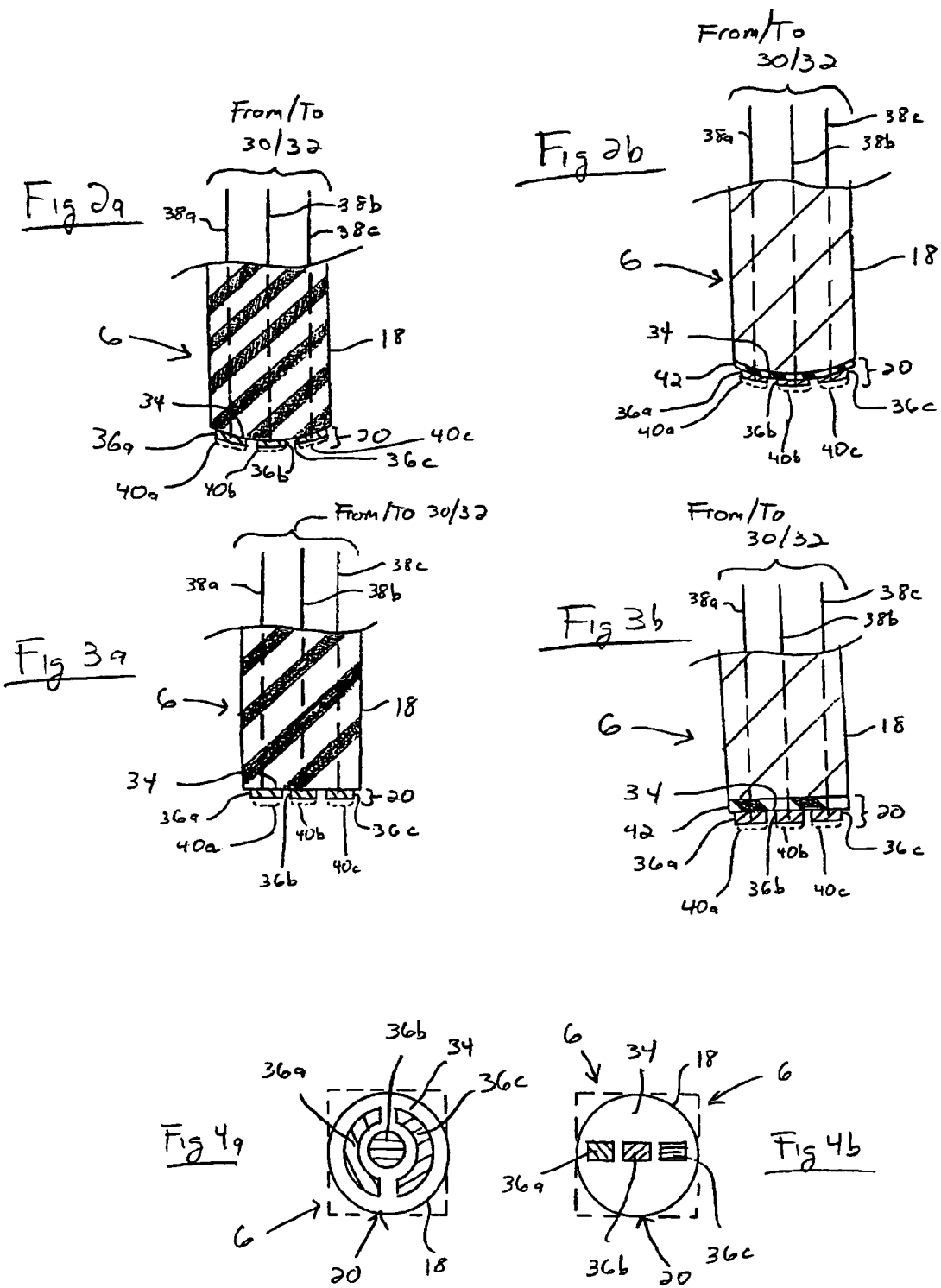

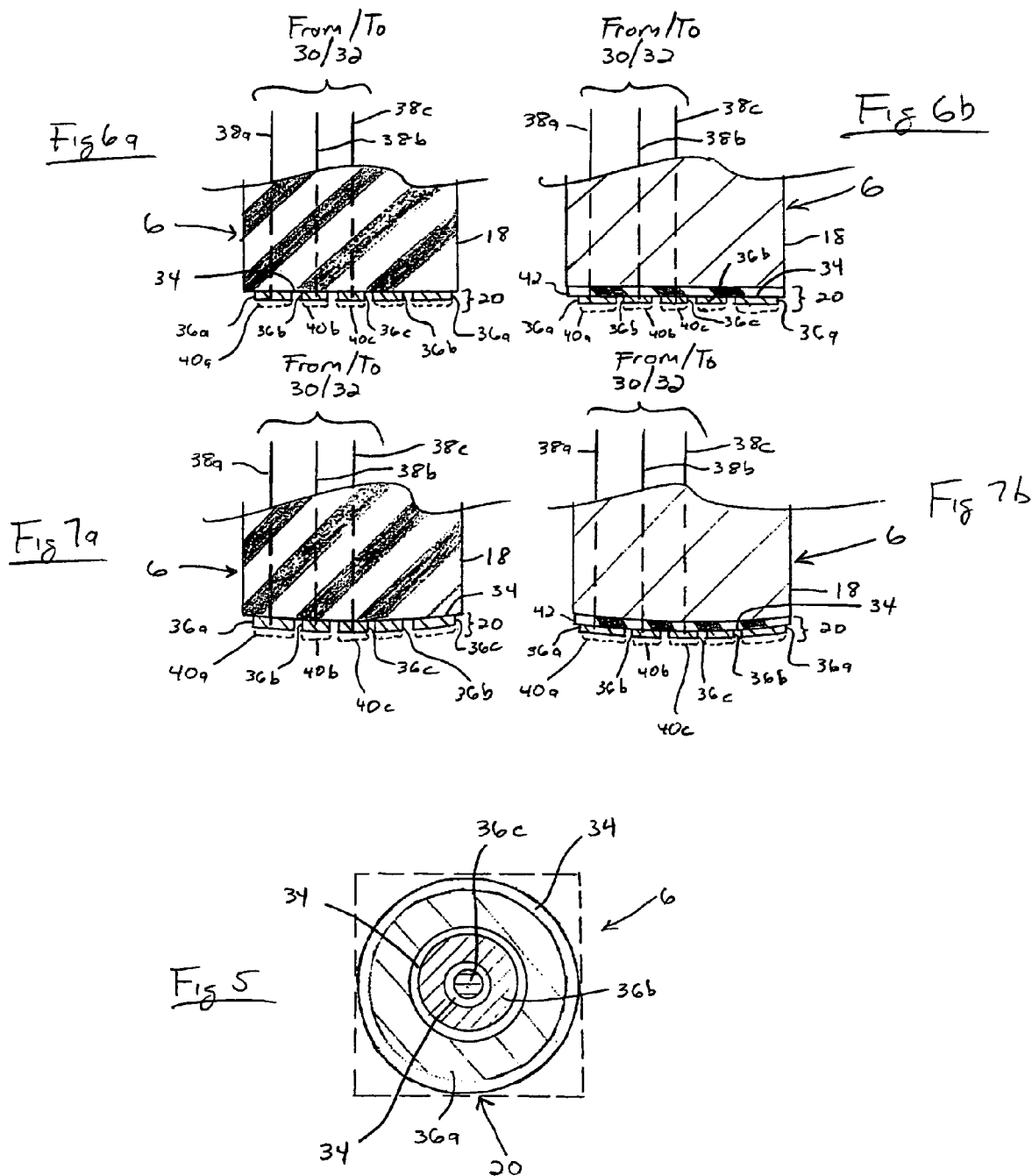

ELASTIC METAL GATE MOS TRANSISTOR FOR SURFACE MOBILITY MEASUREMENT IN SEMICONDUCTOR MATERIALS

BACKGROUND OF THE INVENTION

1. Field of the Invention

The present invention relates to testing of semiconductor wafers or samples and, more particularly, to determining the mobility of charge carriers in a semiconductor wafer or sample, also know as surface channel mobility.

2. Description of Related Art

For semiconductor devices, a major concern is the so-called surface channel mobility. Conventional mobility measurement methods measure either in-part or completely the bulk mobility which is mostly dominated by lattice and impurity scattering effects. However, the performance of high-speed semiconductor devices is limited by the surface mobility of minority carriers in an inversion layer of the semiconductor wafer or sample. This is heavily dependent on scattering at or adjacent the surface of the semiconductor wafer or sample through interface roughness and Coulomb scattering effects. This is a major concern in current and future semiconductor technology.

Heretofore, surface mobility was measured by creating an inversion layer via a MOS transistor formed in the semiconductor wafer or sample. MOS transistors, however, require complete processing of the semiconductor wafer or sample in order to form the source, drain and gate contacts as well as channel implants and metal definition. This is a time-consuming process and does not provide timely feedback about the quality of the process utilized to form the transistors.

It would, therefore, be desirable to overcome the above drawbacks and others by providing a method and apparatus for testing a semiconductor wafer or sample that avoids the need to form a complete MOS transistor therein. Still other benefits of the invention will be apparent to those of ordinary skill in the art upon reading and understanding the following detailed description.

SUMMARY OF THE INVENTION

The invention is a method of testing a semiconductor wafer or sample having a substrate of semiconducting material. The method includes (a) providing first, second and third electrically conductive contacts positioned on a carrier in electrical isolation from each other; (b) providing an electrical power source having a first terminal connected to the first and second contacts and a second terminal connected to the third contact; (c) causing the contacts to move into spaced relation with a topside of a substrate of a semiconductor wafer or sample; (d) following step (c), causing the electrical power source to apply an electrical bias between its terminals such that an inversion layer forms in the semiconducting material underlying at least the first contact; (e) measuring a value of a current that flows in the substrate in response to the applied voltage; and (f) determining from the applied electrical biases and the measured current a surface mobility of minority carriers in the substrate.

In step (c), each contact can be maintained in spaced relation with the topside of the substrate by a dielectric. The dielectric can reside on the substrate, at least one of the contacts, or both. Desirably, the dielectric in-line between each of at least two of the contacts and the substrate has a thickness that permits a tunneling current to flow therethrough.

The second contact can be positioned between the first and third contacts. The third contact can surround the second contact which can surround the first contact.

The first and third contacts can be formed from iridium that does not facilitate the formation of a dielectric thereon. The second contact can be formed from tantalum that facilitates the formation of additional dielectric thereon. A majority of the current flowing in the semiconducting material can flow through the first and third contacts.

The carrier can be formed from an electrical insulating material or an electrically conductive material having an electrical insulating material disposed between the contacts and the electrically conductive material.

The invention is also an apparatus for testing a semiconductor wafer or sample having a substrate of semiconducting material. The apparatus includes a probe having first, second and third electrically conductive contacts positioned thereon, with each contact electrically isolated from the other contacts, and means for pressing each contact into contact with a top surface of a semiconductor wafer or sample. Means is provided for applying an electrical bias to the contacts when they are touching the top surface of the semiconductor wafer or sample such that the first and second contacts are biased to a first electrical potential and the second contact is biased to a second electrical potential, whereupon, in response to the applied electrical bias, an inversion layer forms in the semiconducting material underlying at least the first contact. Means is also provided for measuring a value of current flowing in the semiconductor wafer or sample in response to said applied electrical bias. Lastly, means is provided for determining from the applied electrical bias and the measured value of current flowing in the semiconductor wafer or sample a surface mobility of minority carriers in the semiconductor wafer or sample.

The top surface of the semiconductor wafer or sample can either be a top surface of the semiconductor wafer or sample substrate or a top surface of an insulator overlaying the semiconductor wafer or sample substrate. When the top surface of the semiconductor wafer or sample is the top surface of the semiconductor wafer or sample substrate, at least one contact can include an insulator that touches the top surface of the semiconductor wafer or sample substrate.

Desirably, the insulator of the at least one contact has a thickness that permits the flow of tunneling current therethrough.

The means for applying an electrical bias to the contacts can sweep the first electric potential from a first voltage to a second voltage. The means for measuring a value of current can measure values of current flowing in the semiconductor wafer or sample in response to sweeping the first electrical potential. The means for determining can determine the surface mobility of minority carriers in the semiconductor wafer or sample as a function of changes in the value of the measured current for corresponding changes in the value of the swept electrical potential.

The probe can be formed from either electrically insulating material or electrically conductive material. When the probe is formed from electrically conductive material, an electrically insulating material can be provided between the electrically conductive material and the contacts.

Lastly, the invention is a method of testing a semiconductor wafer or sample having a substrate of semiconducting material. The method includes compressing dielectric between each of three electrically conductive contacts and a top surface of the semiconductor wafer or sample substrate, wherein the dielectric has a thickness that permits tunneling current to flow therethrough without damaging the dielectric; applying a first electrical potential to a pair of adjacent contacts and a second electrical potential to the other contact whereupon an inversion layer forms in the semiconductor wafer or sample in response to the applied electrical potentials; measuring a value of a current that flows in the semiconductor wafer or sample substrate and across the dielectric, in the form of a tunneling current, in response to the applied electrical potentials; and determining surface mobility of minority carriers in the semiconductor wafer or sample as a function of at least one of the applied electrical potentials and the value of the measured current.

The dielectric can reside on at least one contact, the semiconductor wafer or sample substrate or both. One contact can be formed of a material that permits additional dielectric to form thereon whereupon a majority of the current that flows in the semiconductor wafer or sample substrate and across the dielectric flows through the other two contacts.

BRIEF DESCRIPTION OF THE DRAWINGS

FIGS. 2(a)-3(b) are cross sections of exemplary carriers having a plurality of contacts for testing a semiconductor wafer or sample in accordance with the present invention;

FIGS. 4(a) and 4(b) show exemplary arrangements of the contacts of the carriers of FIGS. 2(a)-3(b) that can be utilized for testing a semiconductor wafer or sample in accordance with the present invention;

FIG. 5 shows another exemplary arrangement of contacts that can be utilized for testing a semiconductor wafer or sample in accordance with the present invention;

FIGS. 6(a)-7(b) are cross sections of exemplary carriers having the arrangement of contacts shown in FIG. 5;

DETAILED DESCRIPTION OF THE INVENTION

The present invention will be described with reference to the accompanying figures, where like reference numbers are utilized for describing like elements.

Figure 1:
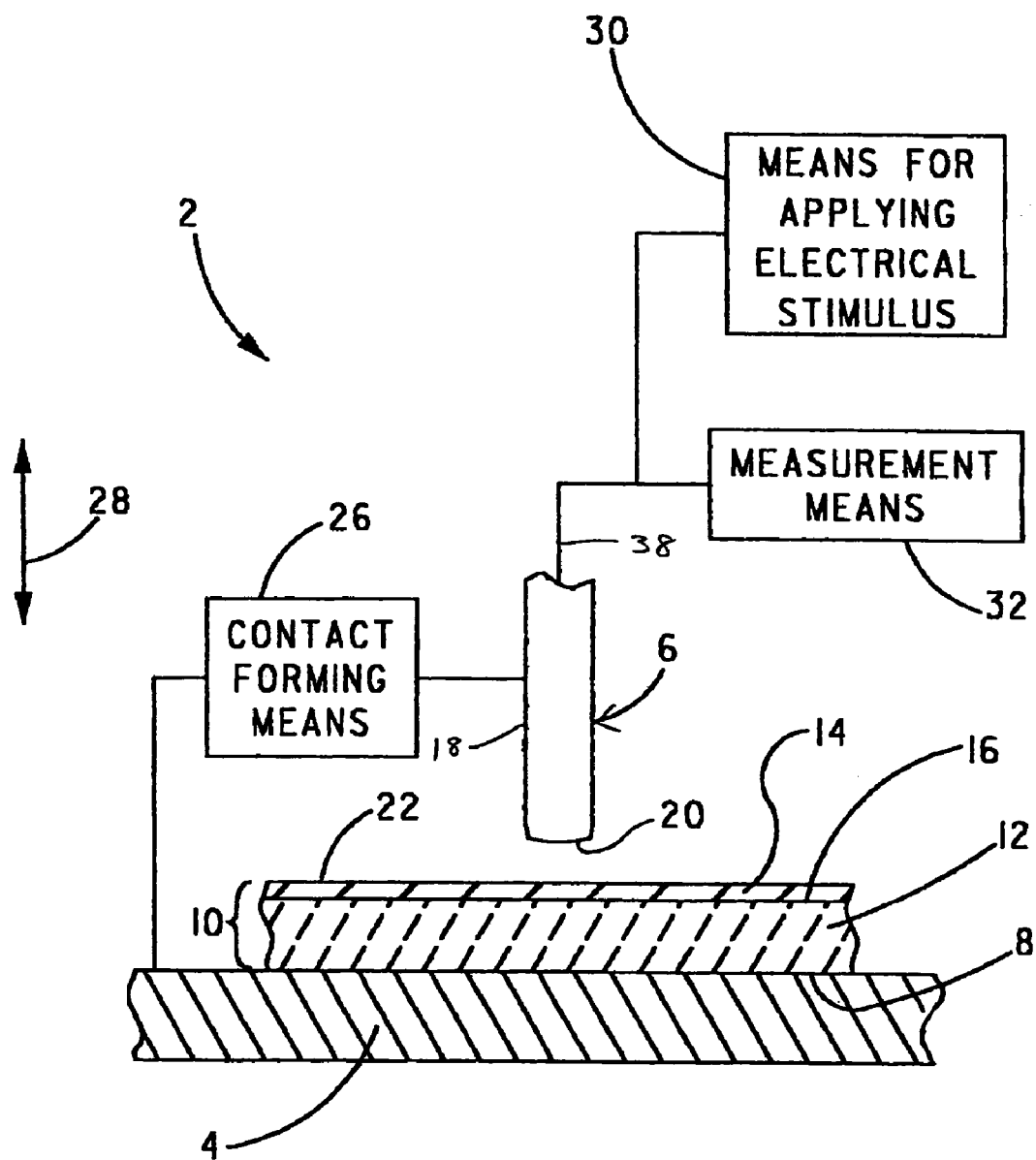
FIG. 1 is a combined schematic view and cross-sectional view of a semiconductor wafer or sample test system.

With reference to FIG. 1, a semiconductor wafer or sample test system 2 includes an electrically conductive vacuum chuck 4 and a carrier 6. The illustration of carrier 6 in FIG. 1 in the form of an elongated probe is not to be construed as limiting the invention since it is envisioned that carrier 6 can have any suitable shape or form. Chuck 4 is configured to support a backside 8 of a semiconductor wafer or sample 10 which includes a substrate 12 formed of semiconducting material which is held in contact with chuck 4 by means of a vacuum (not shown). Semiconductor wafer or sample 10 desirably, but not necessarily, includes a dielectric layer 14 overlaying a topside 16 of substrate 12.

In the illustrated embodiment, carrier 6 includes a body or shaft 18 having disposed, e.g., at one end thereof, a contact portion or tip 20 configured to contact topside 16 of substrate 12 or a topside 22 of dielectric layer 14 when present. Embodiments of carrier 6 having contact portions or tips 20 of various shapes and configurations that are suitable for testing semiconductor wafer or sample 10 in accordance with the present invention will be described hereinafter.

A contact forming means 26, of the type well-known in the art, controls the vertical movement of chuck 4 and/or carrier 6, in one or both of the directions shown by two-headed arrow 28 to move carrier 6 and/or semiconductor wafer or sample 10 such that a distal end of tip 20 presses into contact with topside 16 of substrate 12 or topside 22 of dielectric layer 14 when present.

A means for applying electrical stimulus 30 can be electrically connected to apply a suitable electrical stimulus to tip 20 of carrier 6 when tip 20 is in contact with topside 16 of substrate 12 or topside 22 of dielectric 14 when present.

A measurement means 32 can be electrically connected for measuring the response of semiconductor wafer or sample 10 to the test stimulus applied by the means for applying electrical stimulus 30 to tip 20 in contact with topside 16 of substrate 12 or topside 22 of dielectric 14 when present. Desirably, in accordance with the present invention, chuck 4 is not connected to a reference bias, such as ground, but is left "floating".

With reference to FIG. 2(a) and with continuing reference to FIG. 1, in one embodiment of carrier 6, shaft 18 is made of a dielectric or insulating material and the distal end of shaft 18 supporting tip 20 has a curved surface 34, e.g., a globe shaped surface, a ball shaped surface, an arcuate shaped surface, and the like. Tip 20 includes three electrically conductive contacts 36a-36c positioned on surface 34 in electrical isolation from each other. Desirably, each contact 36 is made from an elastically deformable material. However, this is not to be construed as limiting the invention. In one non-limiting embodiment, contacts 36a and 36c are formed from iridium and contact 36b is formed from tantalum. However, this is not to be construed as limiting the invention.

Contacts 36a-36c are connected to the means for applying electrical stimulus 30 and measurement means 32 via suitable conductors 38a-38c, respectively, that are electrically isolated from each other. In FIG. 2(a), each conductor 38 is illustrated as running through shaft 18. However, this is not to be construed as limiting the invention since it is envisioned that each conductor 38 can be routed in any suitable and/or desirable manner between its corresponding contact and the means for applying electrical stimulus 30 and measurement means 32.

If desired, one or more of contacts 36a-36c can include an optional dielectric 40a-40c (shown in phantom), respectively, disposed thereon opposite shaft 18.

The embodiment of carrier 6 shown in FIG. 2(b) is similar to the embodiment of carrier 6 shown in FIG. 2(a) except that in the embodiment of carrier 6 shown in FIG. 2(b) shaft 18 is made from a conductive material and tip 20 includes a dielectric 42 positioned between shaft 18 and each contact 36a-36c. In the embodiment of carrier 6 shown in FIG. 2(b), arcuate surface 34 is the surface of dielectric layer 42 opposite shaft 18 and tip 20 includes dielectric 42, contacts 36a-36c and, optionally, one or more dielectrics 40a-40c (shown in phantom) if desired.

FIGS. 3(a) and 3(b) show embodiments of carrier 6 similar to those shown in FIGS. 2(a) and 2(b), respectively, except that surfaces 34 in FIGS. 3(a) and 3(b) are substantially planar whereas surfaces 34 in the embodiments of carrier 6 shown in FIGS. 2(a) and 2(b) are curved. The curvature of surfaces 34 in the embodiments of carrier 6 shown in FIGS. 2(a) and 2(b) is not to be construed as limiting the invention since said curvature can have any suitable and/or desirable shape not necessarily limited to globe-shaped, ball-shaped, arcuate-shaped, and the like.

FIGS. 4(a) and 4(b) show exemplary configurations of contacts 36 that can be arranged on surfaces 34 of any of the embodiments of carrier 6 shown in FIGS. 2(a), 2(b), 3(a) and 3(b). The configuration of contacts shown in FIGS. 4(a) and 4(b), however, are not to be construed as limiting the invention since contacts 36a-36c can be arranged in any suitable and/or desirable configuration deemed useful by one of ordinary skill in the art to accomplish the testing of semiconductor wafer or sample 10 in the manner described hereinafter.

In the embodiments of carrier 6 shown in FIGS. 2(a) and 3(a), tip 20 comprises contacts 36a-36c and, optionally, one or more dielectrics 40a-40c if desired. In the embodiments of carrier 6 shown in FIGS. 2(b) and 3(b), tip 20 comprises dielectric 42, contacts 36a-36c and, optionally, one or more dielectrics 40a-40c if desired. In FIGS. 4(a) and 4(b), dielectrics 40a, 40b and 40c have been omitted for purpose of simplicity. However, it is to be appreciated that each dielectric 40a, 40b and/or 40c can be included on its corresponding contact in FIGS. 4(a) and 4(b) if desired.

As shown in FIGS. 4(a) and 4(b), shaft 18 and tip 20 of carrier 6 can have a circular profile when viewed from the tip 20 end of carrier 6. Alternatively, shaft 18 and/or tip 20 can have a rectangular or square profile (shown in phantom) when viewed from the tip 20 end of carrier 6. However, these profiles are not to be construed as limiting the invention since shaft 18 and/or tip 20 can have any other shaped profile deemed suitable and/or desirable by one skilled in the art.

FIG. 5 shows another configuration of contacts 36a-36c that may be implemented on tip 20 of any of the embodiments of carrier 6. In FIG. 5, contact 36a surrounds contact 36b which, in turn, surrounds contact 36c. Contacts 36a-36c are spaced from each other in electrical isolation. When viewed from the tip 20 end of carrier 6, tip 20 and/or shaft 18 of carrier 6 can have a circular profile, a square profile, a rectangular profile, or any other shaped profile deemed suitable and/or desirable by one skilled in the art.

FIG. 6(a) shows an embodiment of carrier 6 similar to the embodiment of carrier 6 shown in FIG. 3(a) except that tip 20 in the embodiment of carrier 6 shown in FIG. 6(a) includes the configuration of conductors shown in FIG. 5 disposed on planar surface 34 of shaft 18 formed from a dielectric or insulating material.

FIG. 6(b) shows an embodiment of carrier 6 similar to the embodiment of carrier 6 shown in FIG. 6(a) except that in the embodiment of carrier 6 shown in FIG. 6(b) shaft 18 is made from a conductive material and tip 20 includes dielectric 42 disposed between shaft 18 and contacts 36a-36c. In the embodiment of carrier 6 shown in FIG. 6(b), planar surface 34 is an exposed surface of dielectric layer 42.

In FIGS. 6(a) and 6(b), one or more contacts 36a-36c can include optional dielectric(s) 40a-40c, respectively, on a surface thereof opposite shaft 18.

The embodiments of carriers 6 shown in FIGS. 7(a) and 7(b) are similar to the embodiments of carriers 6 shown in FIGS. 6(a) and 6(b), respectively, except that in the embodiments of carriers 6 shown in FIGS. 7(a) and 7(b), surfaces 34 are curved, e.g., globe-shaped, ball-shaped, arcuate-shaped, and the like.

Use of the embodiment of carrier 6 shown in FIG. 3(a) for testing semiconductor wafer or sample 10 having a substrate 12 formed of a p-type material having an overlaying dielectric layer 14 will now be described with reference to FIG. 8 and with continuing reference to FIG. 1.

Figure 8:
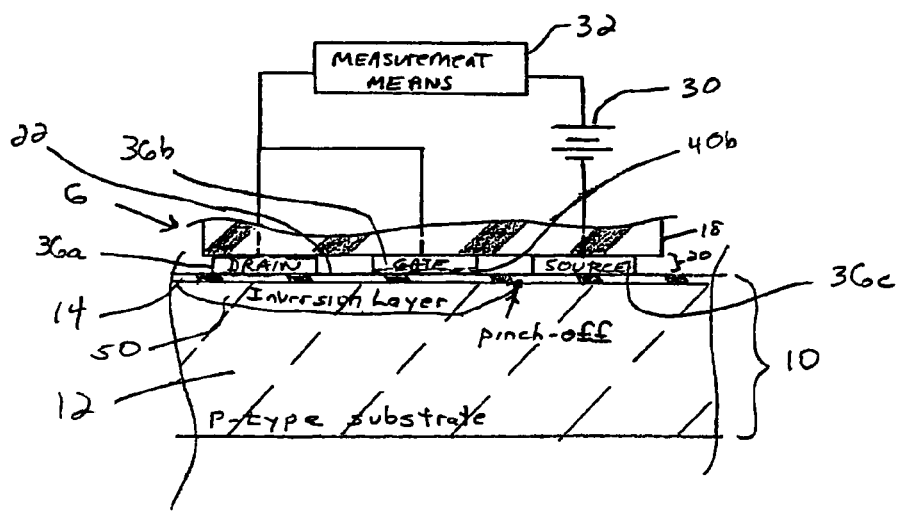
FIG. 8 is a combined schematic view and cross-sectional view of the carrier of FIG. 3(a) with the contacts thereof in contact with the top surface of the semiconductor wafer or sample of FIG. 1.

FIG. 8 shows contacts 36a-36c of the embodiment of carrier 6 shown in FIG. 3(a) in contact with topside 22 of dielectric layer 14 overlaying semiconductor wafer or sample 10. In FIG. 8, contacts 36a-36c are labeled drain, gate and source, respectively, for the purpose of describing the present invention. However, this is not to be construed as limiting the invention.

Desirably, drain contact 36a and source contact 36c are formed from a first conductive material, such as iridium, that does not facilitate the growth of a native dielectric, e.g., oxide, thereon. In contrast, gate contact 36b is desirably formed from a second conductive material, such as tantalum, that facilitates the growth of a relatively thin native dielectric 40b thereon. Thus, in the embodiment of carrier 6 shown in FIG. 8, tip 20 includes contacts 36a-36c and dielectric 40b. The use of a first conductive material to form drain and source contacts 36a and 36c and the use of a second conductive material to form gate contact 36b, however, is not to be construed as limiting the invention.

At a suitable time after contact forming means 26 presses drain and source contacts 36a and 36c and dielectric layer 40b of gate contact 36b into contact with topside 22 of dielectric layer 14 of semiconductor wafer or sample 10, means for applying electrical stimulus 30 electrically biases contacts 36a-36c such that a so-called inversion layer 50 forms in substrate 12 of semiconductor wafer or sample 10 adjacent dielectric layer 14. When contacts 36a and 36c and dielectric layer 40b of gate contact 36b are pressed into contact with topside 22 of dielectric layer 14, contacts 36a and 36c and dielectric layer 40b and, hence, contact 36b are positioned in spaced relation with top surface 16 of substrate 12 of semiconductor wafer or sample 10 as shown.

As used herein, "inversion layer" is defined as a layer of a semiconductor substrate, such as substrate 12, that includes more minority carriers than majority carriers, even though the substrate has been doped with majority carriers.

As shown in FIG. 8 for substrate 12 formed of p-type material, means for applying electrical stimulus 30 applies a positive voltage to drain and gate contacts 36a and 36b and applies a reference voltage, e.g., ground, to source contact 36c. The application of the positive voltage to drain and gate contacts 36a and 36b depletes the region of substrate 12 thereunder of holes, thereby forming inversion layer 50 having more electrons than holes. Because means for applying electrical stimulus 30 applies the reference voltage to source contact 36c, holes are retained in the region of substrate 12 underlying source contact 36c.

A so-called "pinch-off" point is defined between inversion layer 50 and the region of substrate 12 underlying source contact 36c. This pinch-off point is so-called because inversion layer 50 does not extend to the region of substrate 12 underlying source contact 36c and, as a result, the value of current flowing through source contact 36c will be relatively small due to the resistance of substrate 12 between the pinch-off point and the region of substrate 12 underlying source contact 36c. The concept of the pinch-off point is well-known in the art of semiconductors and will not be described further herein.

Figure 9:
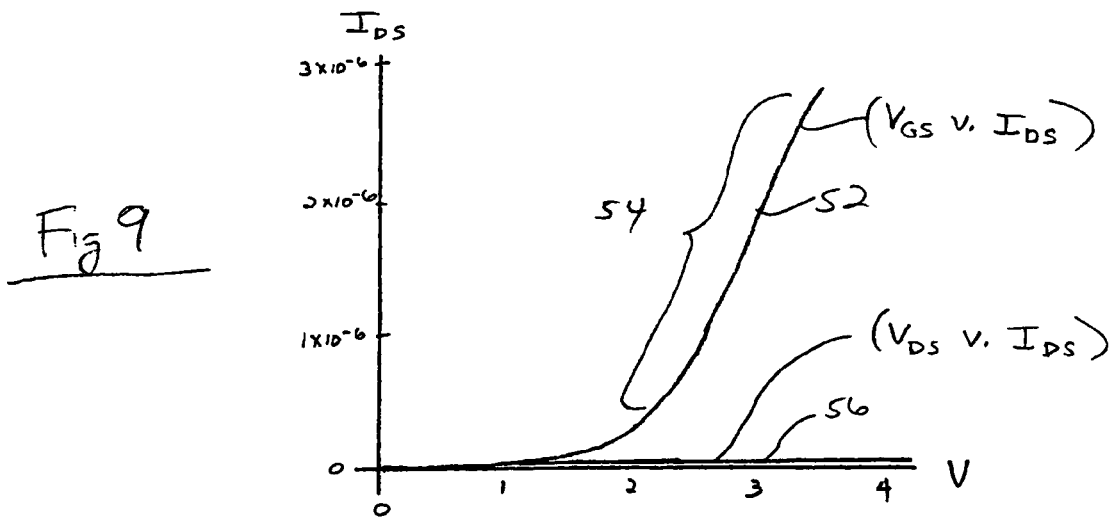
FIG. 9 is an exemplary plot of $V_{GS}$ versus $I_{DS}$ for the embodiment of the carrier and the semiconductor wafer or sample shown in FIG. 8.

With reference to FIG. 9 and with continuing reference to FIGS. 1 and 8, in response to the means for applying electrical stimulus 30 increasing the voltage ($V_{GS}$) applied to drain and gate contacts 36a and 36b from a first voltage, e.g., 0 volts, toward a second voltage, e.g., 4 volts, an electrical current ($I_{DS}$) commences flowing from drain contact 36a to source contact 36c via substrate 12 and dielectric layer 14.

Dielectric layer 14 is sufficiently thin, e.g., no more than about 30 Angstroms, to facilitate this flow of current via a transport mechanism known as "tunneling current". As shown in FIG. 9, in response to increasing the voltage applied to drain and gate contacts 36a and 36b, the value of $I_{DS}$ increases. A slope of a plot 52 of $V_{GS}$ versus $I_{DS}$ in a linear region 54 thereof is a measure of the resistance between the pinch-off point and source contact 36c and, hence, the surface mobility of carriers in substrate 12.

Dielectric 40b disposed between electrically conductive gate contact 36b and dielectric layer 14 of semiconductor wafer or sample 10 increases the effective thickness of the dielectric in-line between gate contact 36b and substrate 12 to a sufficient extent such that little or no tunneling current flows therethrough. Accordingly, a majority of the current that flows in response to the voltage applied by means for applying electrical stimulus 30 flows between drain and source contacts 36a and 36c.

It has been observed That if gate contact 36b is either not biased or is biased to the same reference voltage as source contact 36c, virtually no current flows between drain contact 36a and source contact 36c in response to increasing the voltage applied to drain contact 36a from a first voltage toward a second voltage. An exemplary plot 56 of $V_{GS}$ versus $I_{DS}$ when gate contact 36b is either not connected or is connected to the same reference voltage as source contact 36c is also shown in FIG. 9.

It is believed the difference between plots 52 and 56 is due to the presence of gate contact 36b between drain contact 36a and source contact 36c and the resulting capacity to produce a well-defined pinch-off point that is spaced away from the portion of substrate 6 underlying source contact 36c. It is further believed that the absence of dielectrics 40a and 40c on drain and source contacts 36a and 36b in combination with dielectric 40b on gate contact 36b also facilitates the formation of plot 52. It has been observed that the use of only two contacts produces a plot like plot 56, whereas the use of three contacts as described herein facilitates the formation of plot 52 wherefrom the surface mobility of carriers in substrate 12 can be determined.

Figure 10:
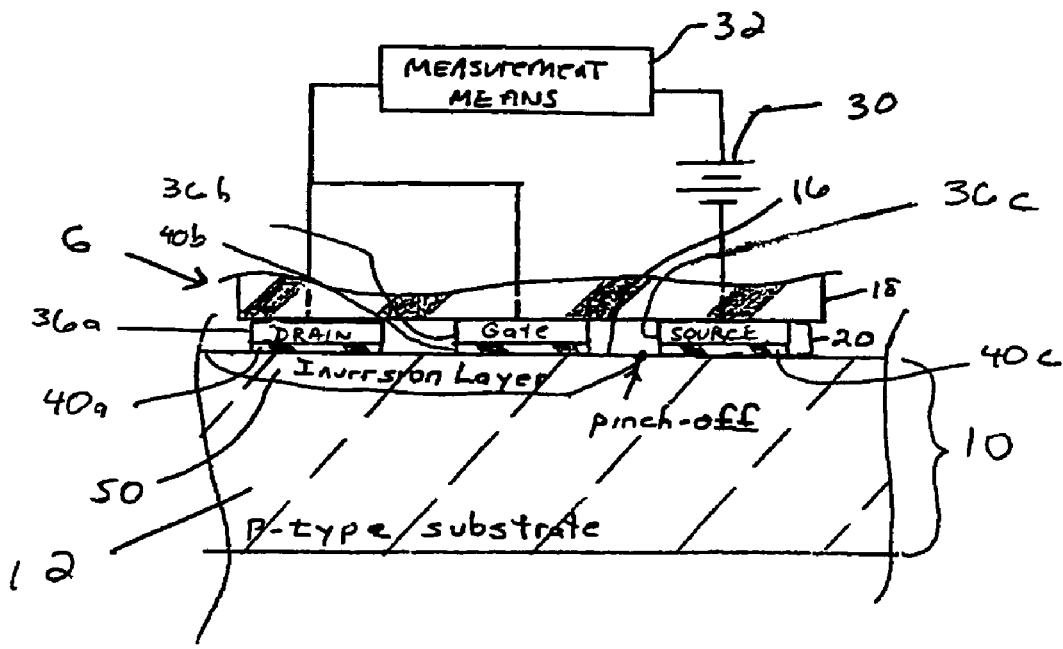
FIG. 10 is a combined schematic view and cross-sectional view of the carrier of FIG. 3(a) with the contacts thereof having overlaying dielectrics in contact with the top surface of a semiconductor substrate of a semiconductor wafer or sample.

With reference to FIG. 10 and with continuing reference to FIGS. 1, 8 and 9, where semiconductor wafer or sample 10 does not include dielectric layer 14, drain contact 36a and source contact 36c desirably include dielectrics 40a and 40c, respectively. This is in addition to gate contact 36b including dielectric 40b. Thus, in contrast to the embodiment of carrier 6 shown in FIG. 8 wherein tip 20 includes contacts 36a-36c and only gate contact 36b includes dielectric 40b, in the embodiment of carrier 6 shown in FIG. 10, tip 20 includes contacts 36a-36c and dielectrics 40a-40c, respectively. Dielectrics 40a and 40c are sufficiently thin, e.g., no more than about 30 Å, to permit tunneling current to flow therethrough. Desirably, however, dielectric 40b is sufficiently thick such that little or no tunneling current flows therethrough. However, this is not to be construed as limiting the invention.

At a suitable time after contact forming means 26 presses dielectrics 40a-40c into contact with top surface 16 of semiconductor substrate 12 of semiconductor wafer or sample 10, means for applying electrical stimulus 30 electrically biases contacts 36a-36c in the same manner as like numbered contacts in FIG. 8 to form a plot, like plot 52, of $V_{GS}$ versus $I_{DS}$ wherefrom the surface mobility of charges in semiconductor wafer or sample 10 can be determined from the slope of the linear part 54 of plot 52. In FIG. 10, contacts 36a-36c are positioned in spaced relation with topside 16 of substrate 12 of semiconductor wafer or sample 10 by dielectrics 40a-40c.

Figure 11:
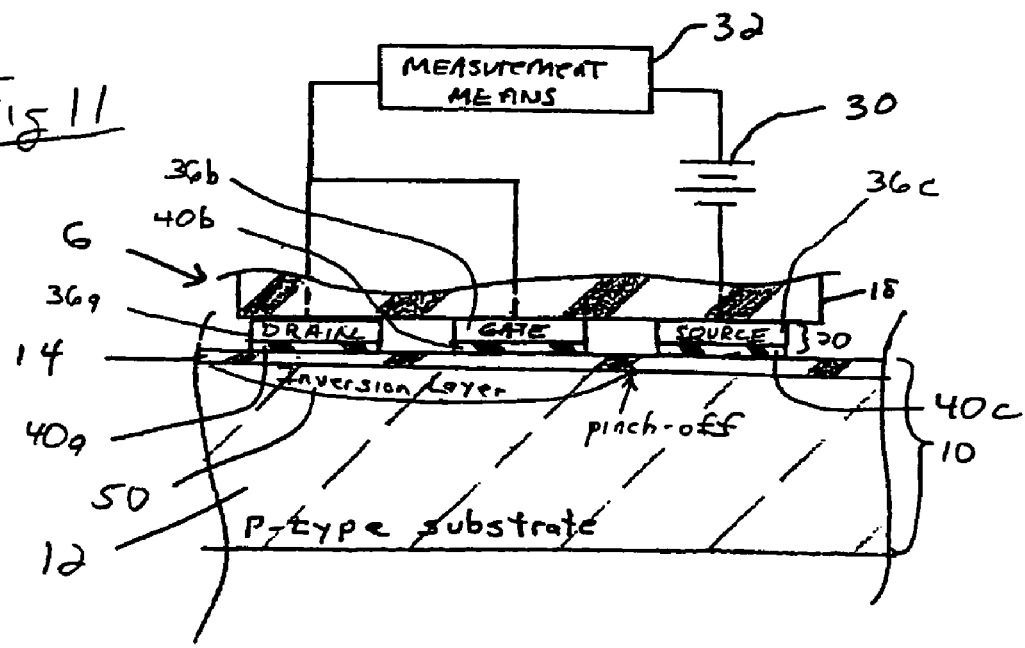
FIG. 11 is a combined schematic view and cross-sectional view of the carrier of FIG. 3(a) with the contacts thereof having overlaying dielectrics in contact with the top surface of a semiconductor wafer or sample having an overlaying dielectric layer.

With reference to FIG. 11 and with continuing reference to FIGS. 1, 8, 9 and 10, where semiconductor wafer or sample 10 includes dielectric layer 14 overlaying substrate 12, carrier 6 desirably includes tip 20 having contacts 36a-36c including corresponding dielectrics 40a-40c which contact dielectric layer 14 during testing. In this embodiment, the combined thicknesses and/or qualities of dielectric layer 14 and dielectric 40a are sufficiently thin, e.g., no more than about 30 Å, such that tunneling current can flow therethrough. Similarly, the combined thicknesses and/or qualities of dielectric layer 14 and dielectric 40c are sufficiently thin, e.g., no more than about 30 Å, such that tunneling current can flow therethrough. However, the combined thicknesses and/or qualities of dielectric layer 14 and dielectric layer 40b are such that little or no tunneling current flows therethrough.

Once dielectrics 40a-40c have been pressed into contact with dielectric layer 14 by contact forming means 26 as shown in FIG. 11, contacts 36a-36c can be biased in the same manner as like numbered contacts in FIGS. 8 and 10 to form a plot, like plot 52, of $V_{GS}$ versus $I_{DS}$ having a linear region, like linear region 54, wherefrom the slope thereof the surface mobility of charges in semiconductor wafer or sample 10 can be determined. In FIG. 11, contacts 36a-36c are positioned in spaced relation with topside 16 of substrate 12 of semiconductor wafer or sample 10 by dielectrics 40a-40c and dielectric layer 14.

In FIGS. 8, 10 and 11, the embodiment of carrier 6 shown in FIG. 3(a) is illustrated, with and without dielectrics 40a, 40b and/or 40c. However, this is not to be construed as limiting the invention since any embodiment of carrier 6 shown in FIGS. 2(a), 2(b), 3(b) and 6(a)-7(b) can be utilized in place of the embodiment of carrier 6 in FIG. 3(a). Moreover, contacts 36a-36c can be configured in any suitable and/or desirable manner and each contact can have any suitable and/or desirable shape not necessarily limited to the configurations shown in FIGS. 4(a), 4(b) and 5. Accordingly, the configurations of contacts 36a-36c described herein are not to be construed as limiting the invention. Moreover, the shape of each surface 34 being curved or planar is not to be construed as limiting the invention since said surface can have any suitable and/or desirable shape deemed suitable by one of ordinary skill in the art.

The invention has been described with reference to the preferred embodiments. Obvious modifications and alterations will occur to others upon reading and understanding the preceding detailed description. For example, while the present invention has been described in connection with the testing of a substrate 12 formed from p-type material, it would be readily recognized by one skilled in the art that the present invention is also applicable to the testing of a substrate formed from n-type material simply by changing the applied electrical bias. It is intended that the invention be construed as including all such modifications and alterations insofar as they come within the scope of the appended claims or the equivalents thereof.

The invention claimed is:

1. A method of testing a semiconductor wafer or sample having a substrate of semiconducting material, the method comprising:
   (a) providing first, second and third electrically conductive contacts positioned on a carrier in electrical isolation from each other;
   (b) providing an electrical power source connected to apply a first electrical bias to the first and second contacts and a second electrical bias to the third contact;
   (c) causing the contacts to move into spaced relation with a topside of a substrate of a semiconductor wafer or sample;
   (d) following step (c), causing the electrical power source to apply the first and second electrical biases such that an inversion layer forms in the substrate underlying at least the first contact;
   (e) measuring a value of a current that flows in the substrate in response to the applied voltage;
   (f) determining from the applied electrical biases and the measured current a surface mobility of minority carriers in the substrate; and
   (g) based on the surface mobility determined in step (f), determining whether the surface mobility of minority carriers in the substrate is acceptable.

2. The method of claim 1, wherein in step (c), each contact is maintained in spaced relation with the topside of the substrate by a dielectric.

3. The method of claim 2, wherein the dielectric resides on at least one of the contacts, the substrate, or both.

4. The method of claim 2, wherein the dielectric in-line between each of at least two of the contacts and the substrate has a thickness that enables the current, in the form of tunneling current, to flow therethrough.

5. The method of claim 1, wherein the second contact is positioned between the first and third contacts.

6. The method of claim 5, wherein the third contact surrounds the second contact which surrounds the first contact.

7. The method of claim 5, wherein in step (c), each contact is maintained in spaced relation with the topside of the substrate by a dielectric on said contact, on the substrate or on both.

8. The method of claim 7, wherein:
   the first and third contacts are formed from iridium that does not facilitate the formation of a dielectric thereon;
   the second contact is formed from tantalum which facilitates the formation of a dielectric thereon; and
   a majority of the current flowing in the semiconducting material flows through the first and third contacts.

9. The method of claim 1, wherein the carrier is formed from:
   an electrical insulating material; or
   an electrically conductive material having an electrical insulating material disposed between the contacts and the electrically conductive material.

10. A method of testing a semiconductor wafer or sample having a substrate of semiconducting material, the method comprising:
    compressing dielectric between each of three electrically conductive contacts and a top surface of the semiconductor wafer or sample substrate, wherein the dielectric has a thickness that permits tunneling current to flow therethrough without damaging the dielectric;
    applying a first electrical potential to a pair of adjacent contacts and a second electrical potential to the other contact whereupon an inversion layer forms in the semiconductor wafer or sample in response to the applied electrical potentials;
    measuring a value of a current that flows in the semiconductor wafer or sample substrate and across the dielectric, in the form of a tunneling current, in response to the applied electrical potentials;
    determining surface mobility of minority carriers in the semiconductor wafer or sample as a function of at least one of the applied electrical potentials and the value of the measured current; and
    based on the determined surface mobility of minority carriers, determining whether the semiconductor wafer or sample has acceptable surface mobility of minority carriers.

11. The method of claim 10, wherein:
    the dielectric resides on at least one contact, the semiconductor wafer or sample substrate or both; and
    one contact is formed of a material that permits additional dielectric to form thereon whereupon the current that flows in the semiconductor wafer or sample substrate and across the dielectric flows through the other two contacts.

* * * * *